(12) United States Patent
Shin

(10) Patent No.: US 6,479,337 B2
(45) Date of Patent: Nov. 12, 2002

(54) SEMICONDUCTOR DEVICE INCLUDING A CHARGE-DISPERSING REGION AND FABRICATING METHOD THEREOF

(75) Inventor: Heon-Jong Shin, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/911,180

(22) Filed: Jul. 23, 2001

(65) Prior Publication Data

US 2001/0039079 A1 Nov. 8, 2001

Related U.S. Application Data

(62) Division of application No. 09/524,069, filed on Mar. 13, 2000, now Pat. No. 6,329,697.

(30) Foreign Application Priority Data

Oct. 4, 1999 (KR) ............................................. 99-42621

(51) Int. Cl.$^7$ ......................................... H01L 21/8238
(52) U.S. Cl. ....................... 438/218; 438/275; 438/279; 438/288; 438/294; 438/405; 438/423
(58) Field of Search ................................ 438/197, 218, 438/219, 221, 294, 295, 353, 404, 405, 423, 585, 587, 618, 624, 926, 275, 279, 183, 288; 257/368, 501, 504, 510

(56) References Cited

U.S. PATENT DOCUMENTS

| | | | | |
|---|---|---|---|---|
| 4,874,714 A | * | 10/1989 | Eklund | 438/200 |
| 5,036,375 A | * | 7/1991 | Mitchell | 257/316 |
| 5,156,990 A | * | 10/1992 | Mitchell | 438/201 |
| 6,020,616 A | * | 2/2000 | Bothra et al. | 257/381 |
| 6,080,682 A | * | 6/2000 | Ibok | 438/770 |
| 6,091,109 A | * | 7/2000 | Hasegawa | 257/339 |
| 6,097,062 A | * | 8/2000 | Gardner et al. | 257/333 |
| 6,143,669 A | * | 11/2000 | Cho | 438/770 |
| 6,165,849 A | * | 12/2000 | An et al. | 438/275 |
| 6,362,074 B2 | * | 3/2002 | Bohr | 438/424 |
| 6,399,488 B2 | * | 6/2002 | Mukhopadhyay et al. | 438/275 |

* cited by examiner

Primary Examiner—Carl Whitehead, Jr.
Assistant Examiner—Maria Guerrero
(74) Attorney, Agent, or Firm—Mills & Onello, LLP

(57) ABSTRACT

A semiconductor device and a method of forming thereof include a dummy active region positioned adjacent the device active region. The dummy active region is formed to include an oxide layer of a thickness that is less than the oxide layer of the active region such that excess charge accumulated during etching in the active region is conducted through the dummy active region into the substrate. In this manner, the dummy active region operates as a charge sink during formation of the active region to prevent premature deterioration of the gate oxide layer of the active region.

9 Claims, 3 Drawing Sheets

SEMICONDUCTOR DEVICE INCLUDING A CHARGE-DISPERSING REGION AND FABRICATING METHOD THEREOF

This application is a Divisional of U.S. application Ser. No. 09/524,069 filed Mar. 13, 2000, now U.S. Pat. No. 6,329,697.

BACKGROUND OF THE INVENTION

1. Field of the Invention

The present invention relates to a semiconductor device and a fabricating method thereof, and more particularly to a semiconductor device and a method of fabricating the device to prevent a gate oxide layer from being deteriorated by damage induced during a plasma fabrication process.

2. Description of the Prior Art

High integration of the semiconductor device has been achieved, in general, through advancements in photo processes and etching processes such as the plasma etching process or the reactivity ion etching process. During such etching processes, electric charge can be accumulated at the floating gate oxide layer, thereby causing a defect on the gate oxide layer and further deteriorating operational properties of the semiconductor device.

Recent trends have led to the common use of a double-metal layering process for fabricating high-speed semiconductor devices. As device integration increases in this manner, the high-density plasma etching process becomes increasingly important for etching narrow lines. During the plasma etching process, serious damage may be inflicted on the gate oxide layer, causing variations in threshold voltage or deterioration of the drain saturated current (Idsat). As a result, the expected lifetime of the gate oxide layer becomes shorter, and operational failure of the semiconductor device is more likely.

In an attempt to alleviate this problem, others have designed a semiconductor device configuration for mitigating deterioration of the gate oxide layer arising from the plasma process, as shown in FIG. 1. In this configuration, the active region of the P type silicon substrate 10 is constructed with N+ diffusion regions 11, 13 to provide transistor sources and drains, and an N+ diffusion region 15 to serve as a cathode for a device protection diode. A polysilicon layer 30 for a gate electrode is formed on the gate oxide layer 20 between the N+ diffusion regions 11, 13. Metal layers 51, 53 are electrically connected to the N+ diffusion regions 11, 13 respectively through contact holes of an inter-level insulating layer 40, and a metal pathway 55 is electrically connected between the N+ diffusion region 15 and the gate electrode 30 through a contact hole in the inter-level insulating layer 40. The P-type silicon substrate 10 below the N+ diffusion region 15 operates as an anode of the protection diode.

In the embodiment of FIG. 1, deterioration of the gate oxide layer 20 due to damage induced in the plasma etching process necessary for deposition of the metal layer 50 is mitigated because the polysilicon layer 30 for the gate electrode and N+ diffusion region 15 for the cathode of the protection diode are electrically connected by the metal layer 55.

However, electric charge in the form of ions, radicals or electrons is accumulated on the polysilicon layer 30 during the selective etching process. Consequently, the charged ions, radicals or electrons flow, via Fowler-Nordheim tunneling current or direct-tunneling current, through the gate oxide layer 20 to the silicon substrate 10. In this manner, the gate oxide layer 20 can suffer from deterioration due to the damage inflicted during the plasma etching process.

SUMMARY OF THE INVENTION

It is an object of the present invention to provide a semiconductor device and a fabricating method thereof for preventing deterioration of the device gate oxide layer by damage induced during a plasma etching process when a selective etching process is performed on a polysilicon layer for a gate electrode.

In order to accomplish the aforementioned object of the present invention, there is provided a semiconductor device comprising a silicon substrate having an active area and a dummy active area. An ion implanted layer is formed in the dummy active area for restricting, or attenuating, oxidation thereof. A first oxide layer of a first thickness is formed on the active area of the silicon substrate. A second gate oxide layer of a second thickness, less than the first thickness, is formed on the ion-implanted layer of the dummy active area. A first gate is formed at a predetermined position of the first gate oxide layer.

Preferably, the second thickness of the second gate oxide layer is less than 20 Angstroms (hereinafter referred to as A). The ion implanted layer can be made of a nitrogen ion implanted layer. In order to form the second thickness of the second gate oxide layer at less than 20A, the density of nitrogen ions is greater than 1E15 atoms/cm$^2$. A second gate can optionally be formed at a predetermined portion of the second gate oxide layer.

In order to accomplish the aforementioned object of the present invention, there is further provided a method of fabricating a semiconductor device. A field oxide region is formed on a silicon substrate for electrically dividing an active area and a dummy active area. A first oxide layer is formed at a first thickness on the active area and a second oxide layer is formed at a second thickness on the dummy active area. A first gate is formed at a predetermined position of the first oxide layer in an etching process, whereby excess charge generated during the etching process is conducted through the dummy active area and into the substrate.

The method may further comprise, following formation of the first and second gate oxide layers, forming a polysilicon layer on the field oxide region and the first and second oxide layers, such that during subsequent formation of the first gate by the etching process, excess charge generated in the region of the active area oxide layer is conducted over the field oxide region, and through the thinner second oxide layer, into the substrate. Following the etching process, portions of the polysilicon layer are preferably masked to electrically insulate the active area from the dummy active area.

Preferably, the second oxide layer is formed at a thickness of less than 20A. The step of forming the second oxide layer includes a step of forming an ion implanted layer where ions are selectively implanted for restricting oxidation at the silicon substrate of the dummy active area. The ion implanted layer can be made of a nitrogen ion implanted layer. In order to form the second thickness of the second oxide layer at less than 20A, the density of nitrogen ions is preferably set to greater than 1E15 atoms/cm$^2$. At the step of forming the first gate, a second gate of the polysilicon layer can also be formed at a predetermined position on the second oxide layer.

Therefore, according to the present invention, if the polysilicon layer is formed at the first and second gate oxide layers of the active and dummy active area by the plasma etching process in a pattern of the polysilicon layer for the first and second gates, electric charge is not accumulated at the polysilicon layer, as the charge is discharged through the second gate oxide layer, thereby preventing deterioration of the gate oxide layer of the active area and thereby maintaining the operational properties of the semiconductor device.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
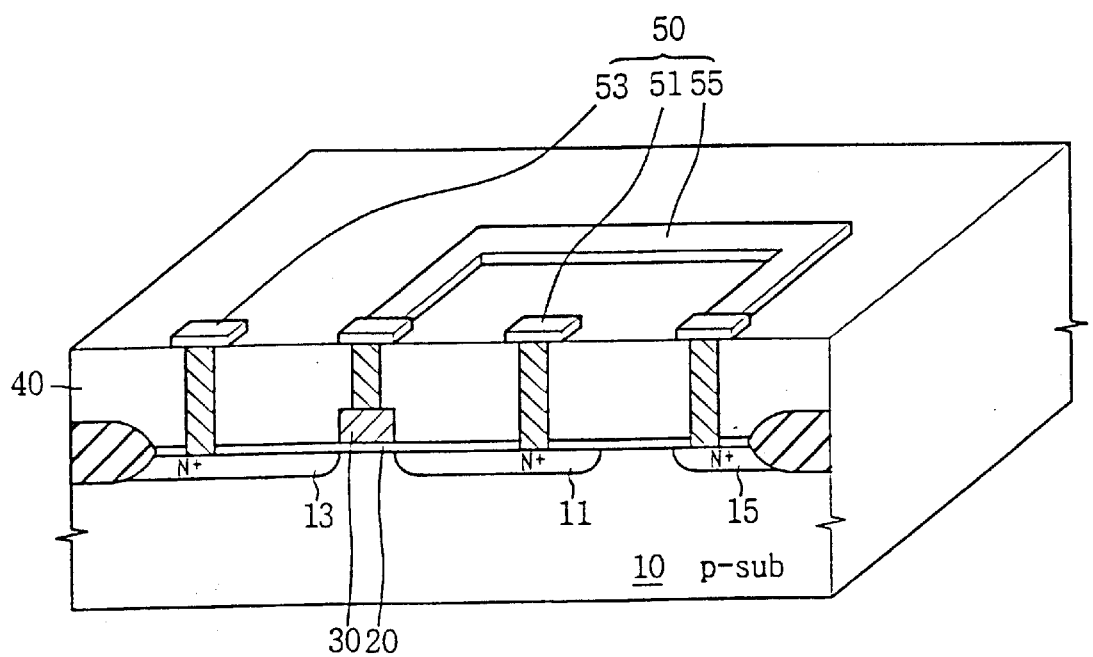
FIG. 1 is a cross-sectional view of a conventional technique for mitigating deterioration of a gate oxide layer in a semiconductor device by employing a protection diode.
Figure 2:
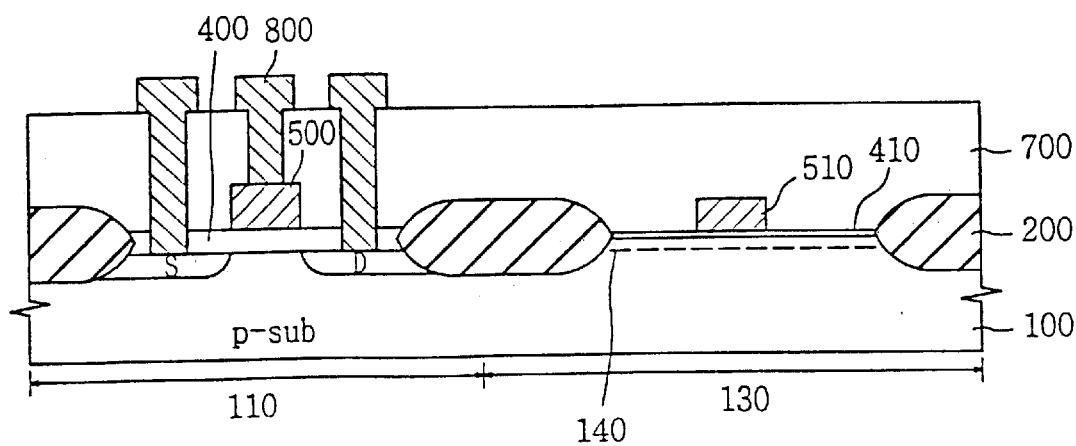
FIG. 2 is a cross-sectional view of a semiconductor device in accordance with the present invention.

FIG. 2 is a cross-sectional diagram for illustrating the structure of the semiconductor device in accordance with the present invention.

As shown in FIG. 2, a field oxide layer 200 is formed a P-type silicon substrate 100 to provide for electric division of an active area 110 and a neighboring charge-sinking area 130 (referred to herein as a "dummy active area"). An ion-implanted layer 140 is formed on the silicon substrate 100 in the dummy active area 130 for restricting oxidation. A first gate oxide layer 400 is formed at a first thickness (T1) on the silicon substrate 100 in the active area 110, and a second gate oxide layer 410 is formed at a second thickness (T2), smaller than the first thickness (T1), on the silicon substrate 100 in the dummy active area 130. The first gate 500 is formed at a predetermined position on the first gate oxide layer 400, and a second gate 510 of polysilicon layer is formed at a position on the second gate oxide layer 410. Source S and drain D are formed on the silicon substrate 100 of the active area 110 with the first gate 500 being positioned therebetween. An insulating protection layer 700 is formed over the active and dummy active areas in accordance with conventional techniques. A pattern of metal layers 800 is electrically connected to the source S and drain D through contact holes of the protection layer 700 and the first gate oxide layer 400. It should be noted that the metal layer 800 is not electrically connected to the second gate 510. It should be further noted that it is not necessary to form the second gate 510 on the second gate oxide layer 410; however the embodiment disclosed herein includes such a second gate 510 for the purpose of example.

The ion implanted layer 140 may comprise, for example, a nitrogen ion implanted layer. By introducing this layer, when the first gate oxide layer 400 and the second gate oxide layer 410 are simultaneously grown, the second thickness T2 of the second gate oxide layer 410 can be made smaller than the first thickness T1 of the first gate oxide layer 400. Particularly, if the density of the nitrogen ions to form the nitrogen ion implanted layer is greater than 1E15 atoms/cm$^2$, the second gate oxide layer 410 can be grown to a second thickness T2 of less than 20A.

The polysilicon layer for the first gate 500 is next deposited over the first gate oxide layer 400, the second gate oxide layer 410 and the field oxide layer 200. While the plasma etching process is selectively performed in a photo etching process to form the first gate 500 and the second gate 510, any electrical charge in the form of ions, radicals or electrons, for example, which otherwise would accumulate at the polysilicon layer, are discharged out through the thinner second gate oxide layer 410 to the silicon substrate 100 in the dummy active area 130.

Since there is no electric charge accumulated in the region of the first gate 500, deterioration of the first gate oxide layer 400 induced during the plasma etching process is substantially eliminated. This leads to enhanced device performance and increased device lifetime.

FIGS. 3 through 8 illustrate sequential processes of a method of fabricating the semiconductor device in accordance with the present invention. The same reference numerals will be used in the following drawings for the same parts as shown in FIG. 2.

Figure 3:
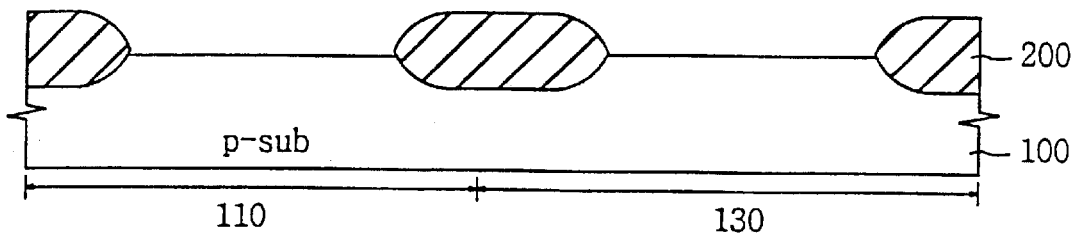
FIGS. 3 through 8 are sequential processes for illustrating a method of fabricating a semiconductor device in accordance with the present invention.

As shown in FIG. 3, for electric division of the first conductivity of the P-type silicon substrate 100 into the active area 110 and the neighboring dummy active area 130, the field oxide layer 200 is formed at the field area of the silicon substrate 100 by the commonly used LOCOS (local oxidation of silicon) process or STI (shallow trench isolation) process. The active area 110 is the location where the semiconductor device is actually to be formed, and the dummy active area 130 is the place where no semiconductor device is to be formed, but instead, a charge-sinking region is to be formed.

Accordingly, a common ion implantation process is performed for forming a device well and for controlling device threshold voltage, in accordance with conventional techniques.

Figure 4:
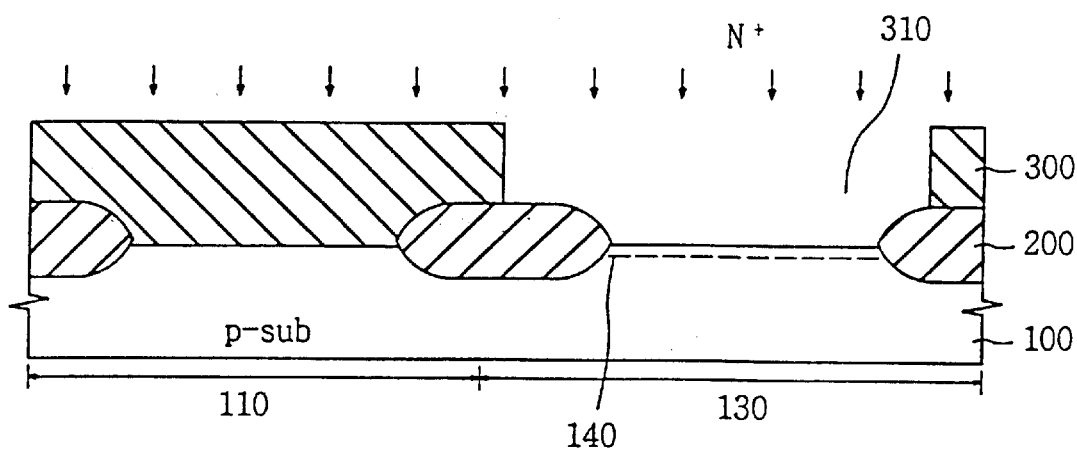

As shown in FIG. 4, a pattern of photo resist layer 300 having an opening 310 positioned at the dummy active area 130 is formed on the silicon substrate 100 of the aforementioned structure. By using the pattern of the photo resist layer as a mask, nitrogen ions are selectively implanted only to the dummy active area 130 to form the nitrogen ion implanted layer 140 on the surface of the silicon substrate 100 of the dummy active area 130 for restricting oxidation. Nitrogen ion implantation prevents oxygen ions from becoming diffused during formation of the second gate oxide layer 410 at the dummy active area 130, such that the resulting second gate oxide layer can be formed at a depth thinner than that of the first gate oxide layer 400 of active area 110.

Figure 5:
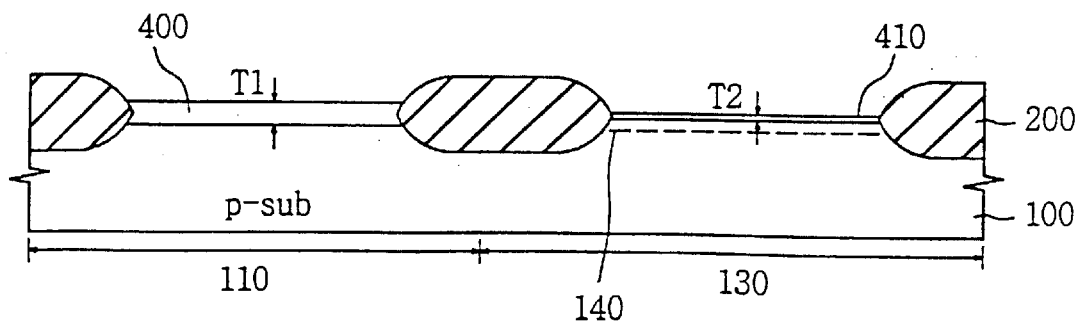

As shown in FIG. 5, after the pattern of the photo resist layer 300 is removed, the field oxide layer 200 is used as a mask to perform a thermal oxidation process to grow the first gate oxide layer 400 of a first thickness T1 on the silicon substrate 100 of the active area 110. At the same time, the second gate oxide layer 410 is grown in the second thickness T2, thinner than the first thickness T1 on the silicon substrate 100 of the dummy active area 130.

The difference between the first thickness T1 of the first gate oxide layer 400 and the second thickness T2 of the second gate oxide layer 410 is closely related to the density of nitrogen ions in the nitrogen ion implanted layer 140. For instance, if the density of the nitrogen ions in the nitrogen ion implantation layer 140 is higher than 1E15 atoms/cm$^2$, the second gate oxide layer 410 can be grown to a thickness of less than 20A to thereby enable electric charge in the form of ions, radicals or electrons accumulated on the polysilicon layer for the first gate 500 shown in FIG. 6 to become discharged out through the second gate oxide layer 410 to the silicon substrate 100 during the subsequent etching process necessary for forming the gate electrode. As a result, electric charge is not accumulated at the first gate oxide layer 400 of the active area 110, thereby preventing its deterioration.

Figure 6:
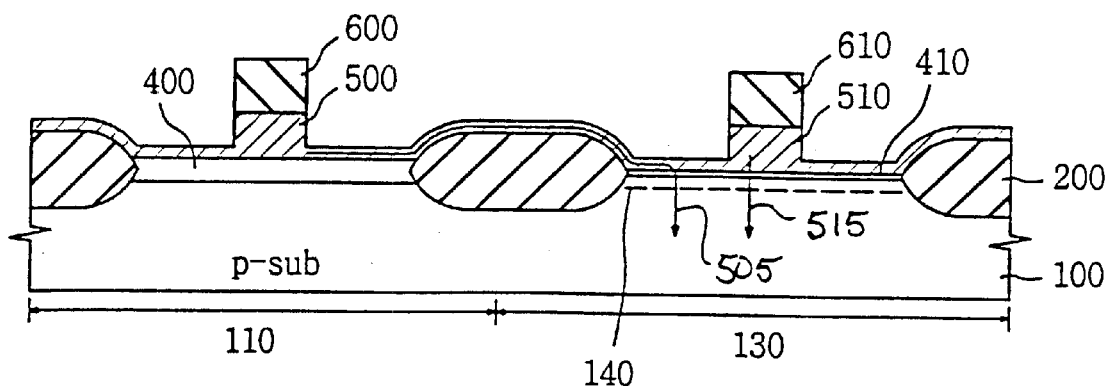

As shown in FIG. 6, after deposition of the polycrystalline layer for the first gate 500 on the first gate oxide layer 400, the second gate oxide layer 410 and the field oxide layer 200, patterns of the photo resist layers 600, 610 for the first and second gates are formed at predetermined portions of the polysilicon layers in the active area 110 and the dummy active area 130 in the photo process.

Next, when the patterns of the photo resist layers 600, 610 are used as masks to begin etching the polysilicon layer for the plasma etching process, electric charge in the form of, for example ions, radicals or electrons, 500, 510 is accumulated on the polycrystalline layers 500, 510 and discharged out through the second gate oxide layer 410 to the silicon substrate 100, as shown by arrows 505, 515 in FIG. 6.

Figure 7:
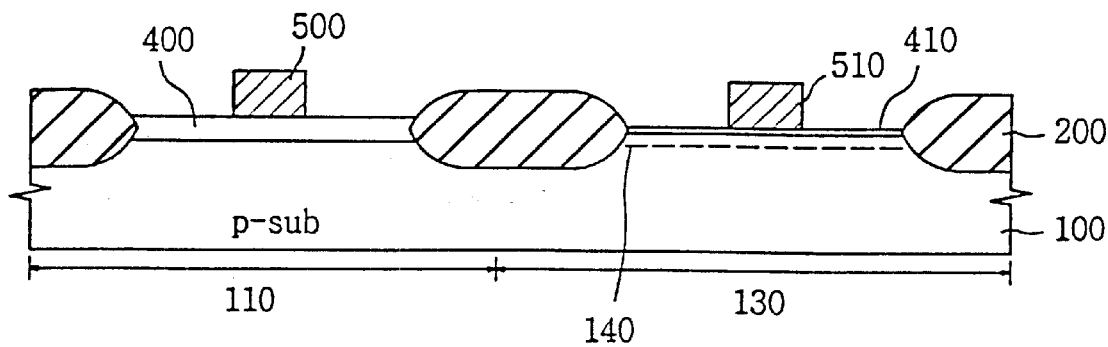

As shown in FIG. 7, the plasma etching process is performed to expose the first and second gate oxide layers 400, 410 on which the first and second gates 500, 510 of polysilicon layers are respectively formed. As a result, the patterns of the photo resist layers 600, 610 positioned at the first and second gates 500, 510 have been removed.

In this manner, electric charge has neither been accumulated on the first and second gates 500, 510, nor on the first and second gate oxide layers 400, 410, thereby mitigating and/or eliminating deterioration of the first gate oxide layer 400 due to damage induced by the plasma etching process. Operational properties of the semiconductor device are thereby maintained.

In an alternative embodiment, the first gate 500 may be formed at the first gate oxide layer 400 without the second gate 510 being formed at the second gate oxide layer 410.

Figure 8:
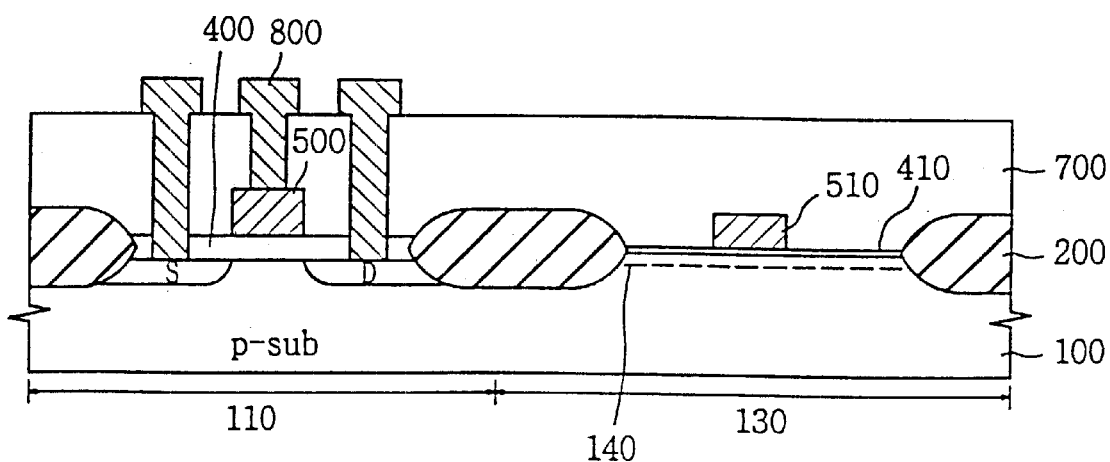

As shown in FIG. 8, a conventional ion implantation process is used for forming source/drain (S/D) regions in the silicon substrate 100 in the active area 110. An inter-level insulating layer 700 is deposited over the first and second gates 500, 510, the first and second gate oxide layers 400, 410 and the field oxide layer 200 in a thickness suitable for flattening the surface thereof. Contact holes are formed in the protection layer 700 and the first gate oxide layer 400 for exposing a portion of the source/drain (S/D), and for exposing a portion of the first gate 500. A metal layer 800 is formed for electrically connecting through the contact holes to the source/drain (S/D) and the first gate 500. Since the dummy active area has served its purpose as a charge sink, there is no reason to connect the metal layer 800 to the second gate 510.

As described above, the method of fabricating the semiconductor device of the present invention comprises the steps of forming the active area; forming a neighboring dummy active area electrically divided by the field oxide layer; forming the nitrogen implanted layer at the silicon substrate of the dummy active area for restricting oxidation; forming the thick gate oxide layer at the silicon substrate of the active area and the thin gate oxide layer at the silicon substrate of the dummy active area by the thermal oxidation process; respectively depositing the polysilicon layers at the gate oxide layers and respectively forming gates at the polysilicon layers of the active and dummy active areas in the plasma etching process; and etching out the remainder of the polysilicon layer.

As a consequence, electric charge such as ions, radicals or electrons are not accumulated at the gate of the active area during the etching processes. Instead, any charge is discharged out through the gate oxide layer of the dummy active area to the silicon substrate. In this manner the gate oxide layer of the active area protected from deterioration by damage induced during the plasma etching process. The operational properties of the semiconductor device are therefore preserved.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A method of fabricating a semiconductor device comprising the steps of:
    forming a field oxide region on a silicon substrate for electrically dividing an active area and a dummy active area;
    forming a first oxide layer at a first thickness on the active area and forming a second oxide layer at a second thickness on the dummy active area, the second thickness being less than the first thickness; and
    forming a first gate at a predetermined position on the first oxide layer.

2. The method as defined in claim 1, wherein the second thickness of the second oxide layer is less than 20A.

3. The method as defined in claim 1, wherein the step of forming the first gate includes the step of forming an second gate of a polysilicon layer at a predetermined position of the second gate oxide layer.

4. The method as defined in claim 1 wherein the step of forming the first gate at a predetermined position on the first oxide layer is provided in an etching process, whereby excess charge generated during the etching process is conducted through the dummy active area and into the substrate.

5. The method as defined in claim 1 further comprising, following formation of the first and second oxide layers, forming a polysilicon layer on the field oxide region and the first and second oxide layers, such that during subsequent formation of the first gate, excess charge generated in the region of the active area oxide layer is conducted over the field oxide region, and through the thinner second oxide layer, into the substrate.

6. The method as defined in claim 1, wherein the step of forming the second oxide layer includes the step of forming an ion implanted layer by selectively implanting ions for restricting oxidation at the silicon substrate of the dummy active area.

7. The method as defined in claim 5 further comprising following formation of the first gate, masking portions of the polysilicon layer to electrically insulate the active area from the dummy active area.

8. The method as defined in claim 6, wherein the ion implanted layer comprises a nitrogen ion implanted layer.

9. The method as defined in claim 8, wherein the nitrogen ions are implanted at the density of greater than 1E15 atoms/cm$^2$ for forming the second thickness of the second gate oxide layer at less than 20A.

* * * * *

UNITED STATES PATENT AND TRADEMARK OFFICE
CERTIFICATE OF CORRECTION

PATENT NO.    : 6,479,337 B2
DATED         : November 12, 2002
INVENTOR(S)   : Heon-Jong Shin It is certified that error appears in the above-identified patent and that said Letters Patent is hereby corrected as shown below:

Column 6,
Line 35, delete "an" and insert -- a --.

Signed and Sealed this

Fifteenth Day of July, 2003

JAMES E. ROGAN
*Director of the United States Patent and Trademark Office*